United States Patent [19]

Pfeiffer et al.

[11] 4,251,728

[45] Feb. 17, 1981

[54] COMPENSATED MAGNETIC DEFLECTION COIL FOR ELECTRON BEAM LITHOGRAPHY SYSTEM

[75] Inventors: Hans C. Pfeiffer, Ridgefield, Conn.; Maris A. Sturans, Bedford, N.Y.

[73] Assignee: International Business Machines Corporation, Armonk, N.Y.

[21] Appl. No.: 61,726

[22] Filed: Jul. 30, 1979

[51] Int. Cl.³ .............................................. G21K 1/08
[52] U.S. Cl. ......................... 250/396 R; 250/396 ML; 250/515; 335/214; 336/84 C
[58] Field of Search ....................... 335/214, 213, 210; 336/84 C; 250/396 ML; 313/440, 421

[56] References Cited

U.S. PATENT DOCUMENTS

| | | | |
|---|---|---|---|
| 2,217,409 | 10/1940 | Hepp | 335/214 |
| 2,793,311 | 5/1957 | Thomas | 315/22 |
| 3,792,305 | 2/1974 | Lister | 315/22 |
| 3,911,321 | 10/1975 | Wardly | 315/364 |
| 3,922,626 | 11/1975 | Hovey | 335/213 |
| 3,984,687 | 10/1976 | Loeffler | 250/396 ML |
| 4,023,129 | 5/1977 | Kratz | 335/210 |

Primary Examiner—Harold A. Dixon
Attorney, Agent, or Firm—Theodore E. Galanthay

[57] ABSTRACT

A toroidal magnetic deflection coil for an electron beam lithography system which is compensated for deflection placement errors that normally result from eddy currents generated within the coil windings by deflection current inputs to the coil. The compensation is achieved through addition of passive conductive material along the outer periphery of the coil. The conductive material or layer is arranged close to the outer arms of the toroidal coil windings, and thereby compensates the eddy currents within the deflection coils generated by the deflection currents in the inner arms. The compensating material can be utilized to compensate for beam drag which results from the driving circuit settling time and the inductive or capacitive coupling as well, by adding more material of appropriate dimensions.

15 Claims, 7 Drawing Figures

COMPENSATED MAGNETIC DEFLECTION COIL FOR ELECTRON BEAM LITHOGRAPHY SYSTEM

DESCRIPTION OF THE INVENTION

Technical Field

The invention relates to magnetic deflection coils for an electron beam lithography system wherein compensation is provided for eddy currents normally generated in the windings of the coil by deflection current inputs to the coil. More particularly, the invention relates to toroidal magnetic deflection coils wherein compensation is provided by addition of a passive conductive compensating means such as copper sheeting about the outer periphery of the coil.

It is an object of the invention to compensate for eddy currents occurring in the windings of a magnetic deflection coil of an electron beam lithography system.

It is another object of the invention to compensate a magnetic deflection system in an electron beam lithography apparatus for deflection error effects such as driver lag and capacitive or inductive coupling within the coil windings.

It is yet a further object of the invention to achieve such compensation through the addition of passive conductive material around the outer periphery of the deflection coil.

It is yet a further object of the invention to provide a technique for theoretically predicting, from Maxwell's equations, the desirable compensation for such a coil, depending upon the time constant of a given deflection system.

These and other objects of the invention are attained in a system wherein a layer of copper sheeting is placed about the outer periphery of a toroidal magnetic deflection coil, where the thickness, height and width of the copper sheeting are carefully calculated to provide compensation for eddy currents and driver settling effects within the coil. The time constant of the compensating material is calculated from Maxwell's equations and the dimensions are selected to provide optimum compensation for all transient effects. The fields generated by the dominant eddy currents in the sheet offset the eddy currents generated in the inner coils adjacent to the beam path and thereby compensate the deflection coil for eddy current effects.

Background Art

Certain magnetic field effects within electron beam systems which result in adverse effects upon beam motion in time and space are well known. For example, the magnetic deflection fields are dynamic in nature, i.e. changes in the deflection coil driving input signals are required for each predetermined movement or deflection of the electron beam. The magnetic deflection fields generated by these currents also generate eddy currents in any conductive material surrounding the beam. The eddy currents in turn generate undesired fields which adversely affect the beam motion in time and space, primarily by exerting drag on the beam.

Since the requirements of beam motion in successful electron beam lithography require precise and swift magnetic deflection of the beam to predetermined target locations, the eddy currents present a major problem in achieving satisfactory electron beam control.

U.S. Pat. No. 3,984,687 to Karl H. Loeffler and Hans C. Pfeiffer, assigned to the assignee of this application, deals with reduction of eddy currents in magnetic deflection coils. The invention described in the patent has been utilized to reduce such eddy currents by fabricating pole pieces and interior lens structures of ferrite and ceramic materials which reduce eddy currents in those components since the conductivity of the nonconductive parts is negligible. Moreover, by locating the deflection yoke centrally within a relatively large lens assembly, the yoke field does not penetrate significantly beyond the pole pieces. Consequently, practically no eddy currents are generated outside the lens.

It has now been found, however, that with the use of electron beam systems having large deflection fields which require relatively large deflection coils fabricated of large conductors, that the eddy currents within the winding structure itself can no longer be ignored.

Although the ideal solution to such eddy currents would be to suppress the intrinsic currents themselves, it has been found that such a solution is not easily provided. Accordingly, a need exists in the prior art for means to suppress the effects of intrinsic eddy currents generated within the windings of a magnetic deflection coil for an electron beam system.

BRIEF DESCRIPTION OF THE DRAWINGS

Various features and advantages of the invention are described hereinafter in the detailed description of the invention taken in conjunction with the accompanying drawings wherein.

DISCLOSURE OF THE INVENTION

Figure 1:
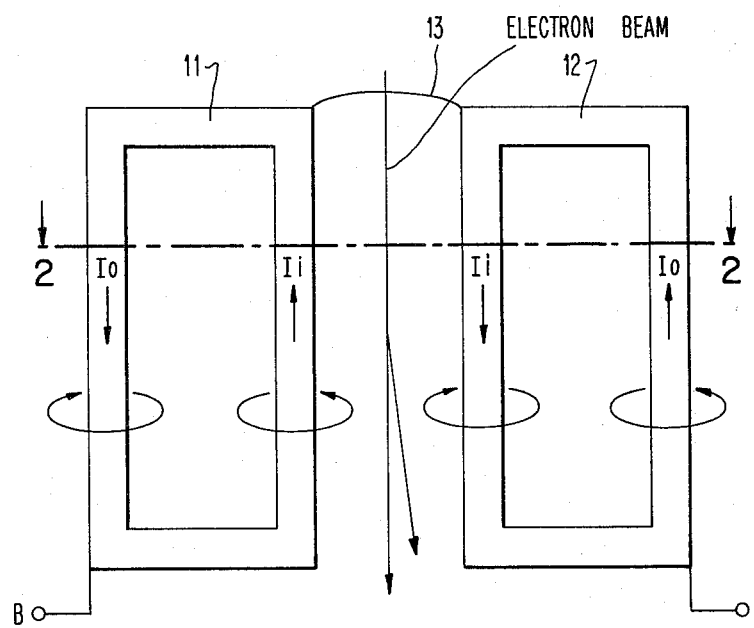
FIG. 1 comprises a schematic view of one pair of windings of a toroidal deflection coil of an electron beam system.
Figure 2:
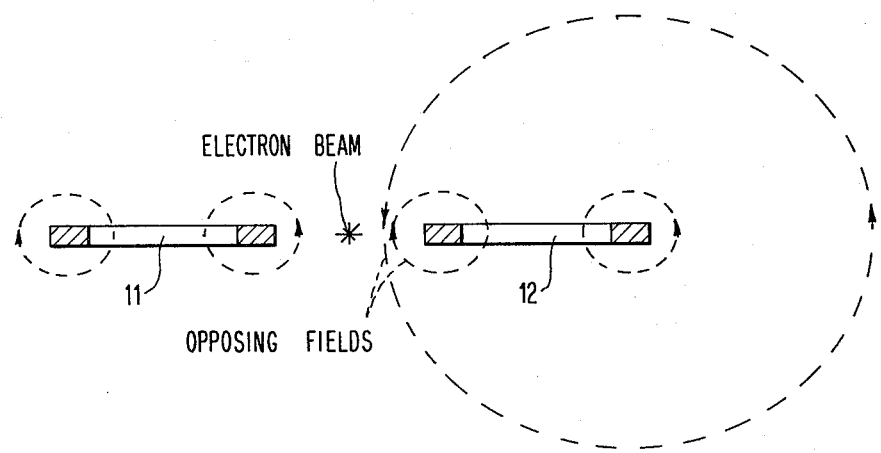
FIG. 2 is a top view of the coil illustrated in FIG. 1 with the magnetic field lines shown in dotted outline.

Referring now to the drawings and particularly to FIGS. 1 and 2, a single set of windings from a magnetic deflection coil are illustrated. These windings typically would be geometrically opposite controlling the deflection of an electon beam in an X or Y direction, for example. It should be understood that a second set of windings would be oriented orthogonally with respect to the windings illustrated to control deflection of the beam in the other access direction.

In the right-hand winding, designated by numeral 12, a deflection current $I_l$ is illustrated having a direction indicated by the arrow flowing through the inner arm of the winding. The current generates a field surrounding the arm having an orientation illustrated by the arrow. In similar fashion, the current flowing through the outer arm of the winding, designated by $I_O$ generates a field having an orientation opposite to the inner arm field. This is best seen in FIG. 2. Since currents $I_O$ and $I_I$ are equal and generate opposing magnetic fields it might seem that the fields would cancel. However, since $I_I$ is much closer to the electron beam, its effect upon the beam is stronger. The deflection current is applied across terminals A and B and flows across interconnection 13 in the customary and well-known manner.

It is well-known that eddy currents occur in conductive material upon changes of current magnitude within the coil, i.e. the eddy currents are proportional to the change in current with respect to time. Since magnetic deflection signals are ramp or step function signals applied each time the deflection of the electron beam is desired, the eddy currents occur repetitively within the windings of the magnetic coil.

Eddy currents generated by $I_I$ oppose the beam motion and exert drag thereon, while eddy currents generated by $I_O$ aid the beam deflection. The overall eddy current strength generated by $I_I$ and $I_O$ in the winding material can be considered equivalent, however, the close proximity of the beam to $I_I$ results in a much stronger eddy current effect due to $I_I$. Consequently the net affect on the electron beam upon deflection of the beam is dragged. Therefore, it is necessary to enhance the eddy current effect due to the outer winding $I_O$ in order to offset the drag effect of the inner winding. This can be accomplished by introducing more conductive material in the vicinity of $I_O$, in accordance with the invention.

Figure 3:
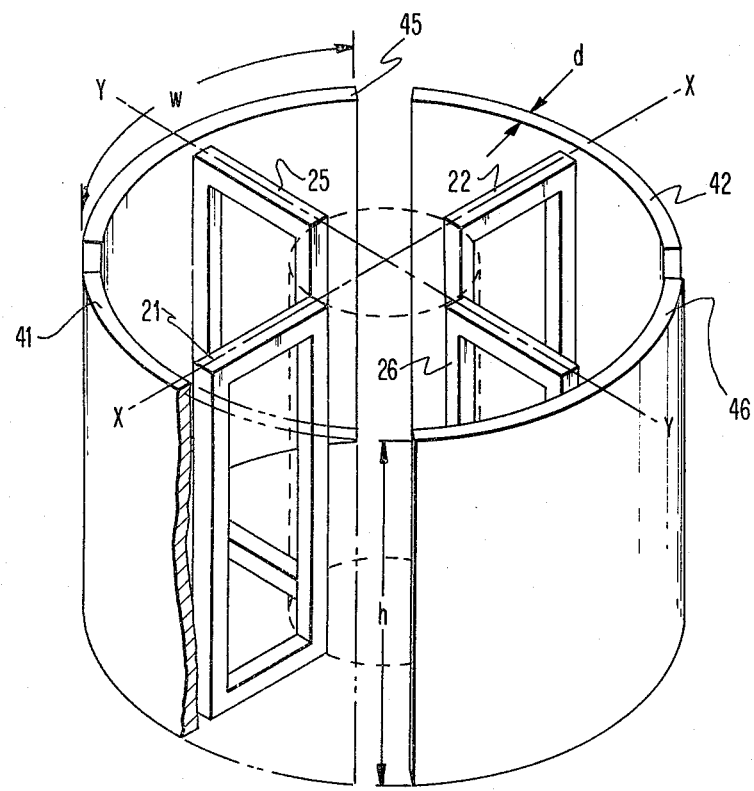
FIG. 3 is a perspective view of a magnetic deflection coil designed in accordance with the invention including compensating sheets formed about the outer periphery thereof.
Figure 4:
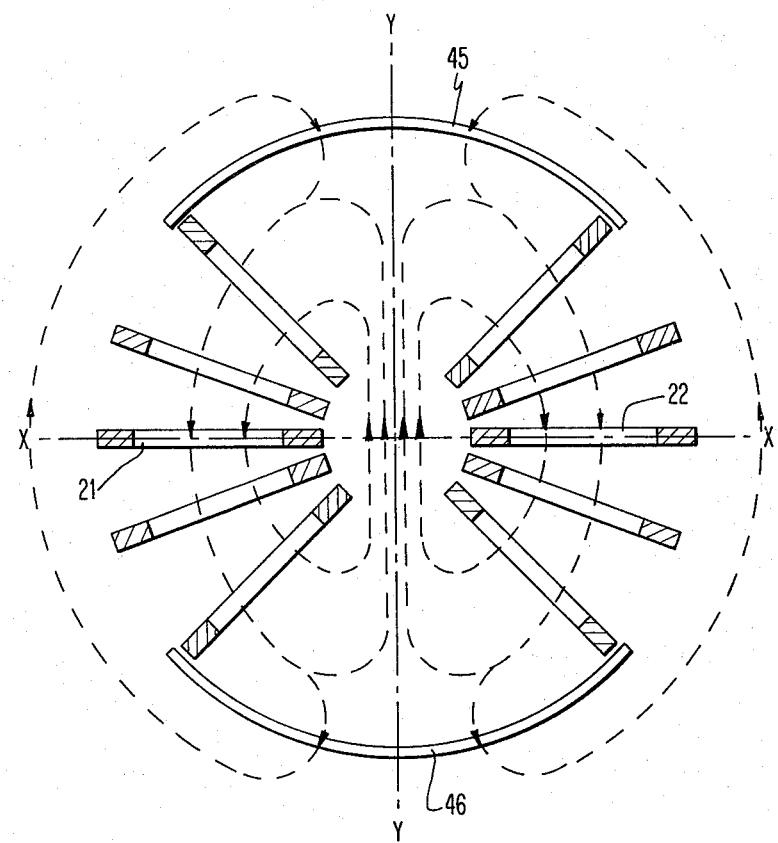
FIG. 4 is a top view of a complete set of windings for the X deflection only, illustrating the resultant magnetic field lines (dotted) and placement of the compensating copper sheets.

Referring now to FIG. 3 and to FIG. 4, the way in which compensation can be achieved is described in more detail. Referring now to FIG. 3 a compensated magnetic deflection coil is illustrated in schematic fashion. The coil comprises windings 21, 22 which control the deflection of the beam in one axis and orthogonally disposed windings 25, 26 which control deflection of the beam in the orthogonal axial direction. Deflection currents are applied to terminals (not shown) as illustrated in FIG. 1.

It should be recognized that each set of windings is placed around a nonconductive core, not illustrated.

It should also be recognized that only a single pair of windings is illustrated in FIG. 3 for each of the X and Y deflection directions. In actual construction the magnetic coil is fabricated of five pairs of windings for the X direction shown in FIG. 4 and an identical format of five pairs of windings for the Y direction. In the preferred embodiment the windings are fabricated of multiple turns of copper wire, i.e. twenty-five turns per winding of high purity copper wire. The coil is approximately 5 centimeters in height, has an outer diameter of 12 centimeters, an inner diameter of about 3 centimeters, and is oriented within the electron beam column to surround the beam path within a projection lens as described in U.S. Pat. No. 3,984,687.

Compensating means 41, 42 are illustrated outside windings 21, 22 and compensating means or sheets 45, 46 are provided outside windings 25, 26 respectively.

Referring to FIG. 4, compensating sheets 45 and 46 are illustrated therein to demonstrate that the compensating sheet for a given winding is oriented in a curved plane centered on an axis Y orthogonal to the deflection axis X, i.e. compensating sheets 45 and 46 are intended to compensate for eddy currents generated by windings 21, 22, respectively. Thus, the compensating sheets are located in a closer proximity to the outer arm of windings 21, 22 than it is to the inner arm of the windings. It should also be noted that the strength of the eddy currents in the sheet increase as the direction of the incident magnetic field approaches 90°, hence the outer arms of the windings again have a stronger effect. As a result, the eddy currents generated in the sheet from the outer arms of the windings are stronger than the eddy current generated in the sheet from the inner arms of the windings. Consequently the opposing fields (which aid in beam deflection) generated by the eddy currents flowing in the compensating sheet are stronger and tend to offset the proximity effects which were previously mentioned in connection with the closeness of the inner arms to the electron beam path. It is noted further that the electron beam path (beam of charged particles) in FIG. 4 is substantially perpendicular to the deflection axis X and axis Y, within the cylindrical space defined by the inner arms of windings 21 and 22.

By adjusting the dimensions of the conductive sheets proper compensation can be attained for a coil having a given time constant.

Figure 5:
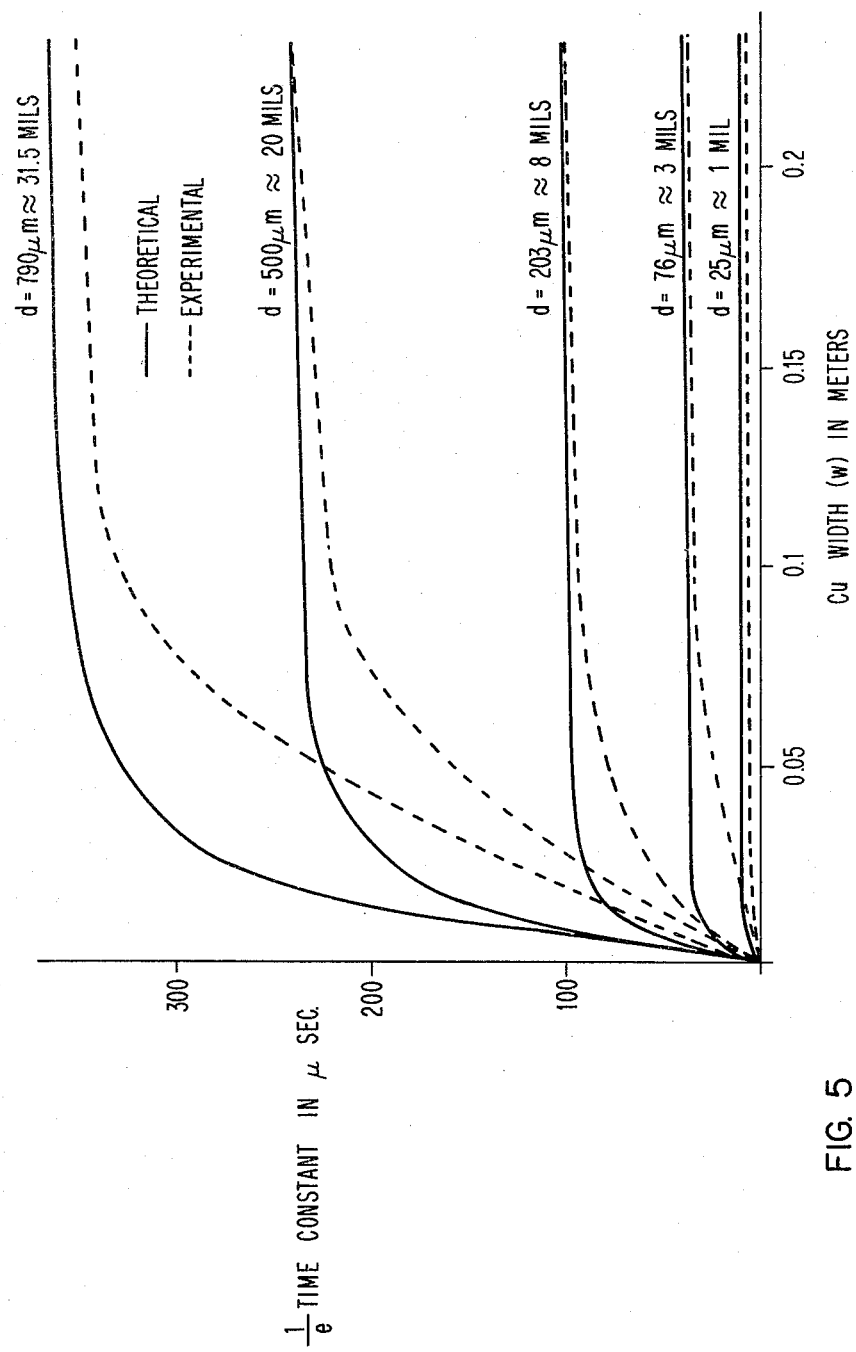
FIG. 5 comprises a graph illustrating a group of time constant solutions for a given geometry calculated from Maxwell's equation.

According to the solution of Maxwell's equation the eddy current time constant of the conductive sheet is equal to:

$$\text{Time constant} = T = \frac{\sigma \mu_o}{\pi^2 \left( \frac{1}{w^2} + \frac{1}{h^2} + \frac{1}{K \delta d} \right)}$$

where;

$$\delta = \text{skin depth} = \sqrt{\frac{2}{\sigma \omega \mu_o}}$$

w = width
h = height
d = thickness
$\sigma$ = conductivity
$\mu_o$ = permeability
$\omega$ = frequency
K = constant = 1350 (empirically derived)
$\pi$ = constant Referring now to FIG. 5 a set of curves are illustrated showing the theoretical and experimental time constants of a copper sheet with a height corresponding to the magnetic deflection coil of the preferred embodiment. In particular, in our preferred embodiment the height of the compensating sheet was taken as 4.96 centimeters (cm.) and various widths and thicknesses of the sheet are represented by the four sets of curves. Thus, the curves in FIG. 5 can be utilized to determine the ideal thickness and width of a compensation sheet having a height of 4.96 cm, to be provided for a coil once the 1/e time constant in microseconds is measured for the coil. Thus, it should be apparent that a coil having a time constant of 200 microseconds can be compensated by a sheet having a thickness of about 20 mils and a width greater than 0.05 meters, for example. Further increases in width will change the eddy current amplitude only; not their time constant.

In similar fashion it should be apparent that a coil having a time constant of about 100 microseconds can be compensated by a sheet having a thickness of 8 mils and a width greater than 0.05 meters. In the preferred embodiment, with a time constant of 35 microseconds, compensation was attained with a sheet of 3 mils thickness and a width greater than 0.05 meters.

The difference between theoretical and experimental results illustrated in FIG. 5 is due to the fact that the calculation is based on a planar geometry copper sheet, while the experiment (for practical reasons) was performed with the sheet wrapped around a small diameter test coil. Since we are primarily interested in the asymptotic time constant (w>h), this angular dependency was omitted from the approximation.

A second effect aside from eddy currents which tends to cause the beam to lag, is introduced by driving circuit settling time, which is a function of the coil inductance. It should be apparent that once the overall settling time of the beam has been measured (eddy current+driving circuit+inductive or capacitive coupling), then a sheet can be specified of a particular geometry for complete compensation.

Figure 6:
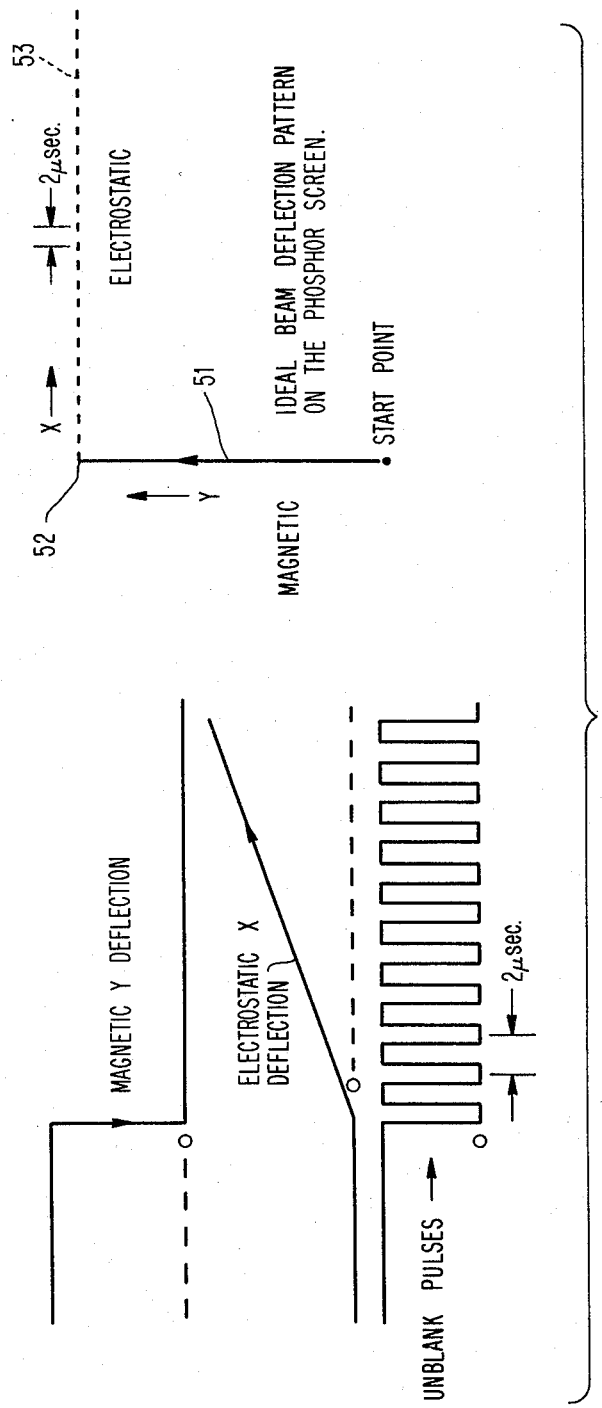
FIG. 6 shows the experimental method for measuring eddy current effects on the electron beam.
Figure 7A:
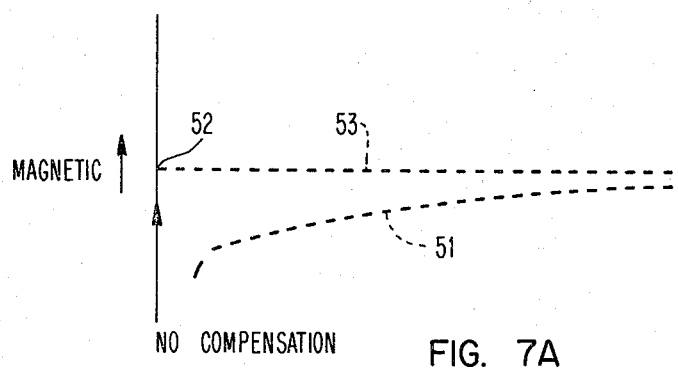
FIGS. 7A–C comprise beam traces showing the affects of no compensation, overcompensation, and proper compensation, respectively, in an electron beam system.
Figure 7B:
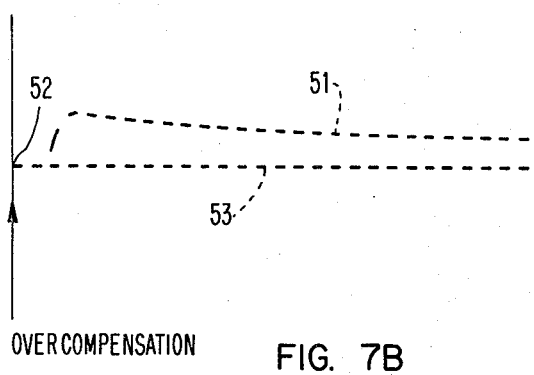
Figure 7C:
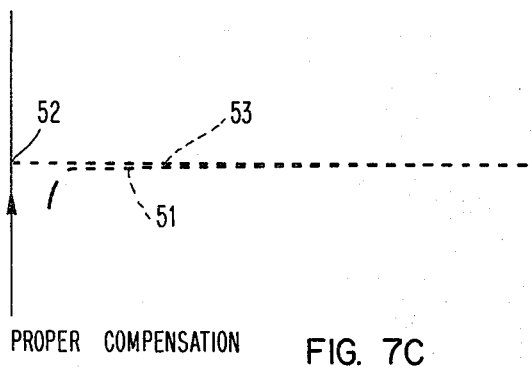

FIG. 6 shows the experimental method used to measure the settling time of the electron beam and the effectiveness of the compensating technique described herein. The ideal circumstance would be for the magnetic deflection 51 to occur along the line perpendicular to the electrostatic trace line 53, and to instantaneously strike target point 52. The actual beam traces are shown in FIG. 7 in various states of compensation. It should be noted that for reference the ideal trace is included in each case, obtained by setting the magnetic deflection to zero. FIG. 7A illustrates beam lag introduced by the deflection coil without compensation. By placing too much compensating material around the coil, the opposite effect can be achieved, FIG. 7B, where the beam overshoots line 53 upon deflection and then gradually returns to a steady state close to line 53 at a later time. In the properly compensated state, FIG. 7C, the beam is deflected immediately close to point 52 and in a very short interval of time traces 53 (ideal) and 51 (actual) merge.

The technique described herein enables a magnetic deflection coil to be provided with a compensation sheet of copper oriented around the periphery of the coil with a fairly close precision to eliminate eddy current effects that were heretofore uncompensated. As magnetic deflection coils become larger and larger in design size, utilizing larger copper wire, such eddy currents have had increasingly deleterious effects upon electron beam deflection. At the same time, the increasingly difficult lithographic requirements necessitated by semiconductor manufacturing utilizing electron beam systems have made increased accuracy of deflection mandatory.

Accordingly, the present invention has resulted in a considerable increase in the capability of electron beam systems to meet microlithographic fabrication requirements.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A magnetic deflection coil for an electron beam lithographic system, said coil including a plurality of toroidal conductive windings, each of said windings including an inner arm and an outer arm, the inner arms defining a cylindrical space for passing a beam of charged particles substantially parallel to the axis of the cylindrical space, said beam of charged particles being deflected along a deflection axis perpendicular to the axis of the cylindrical space by magnetic fields produced by current flow in said plurality of toroidal conductive windings, the current flow including deflection currents and undesired eddy currents, the improvement comprising:
passive conductive compensating means including thin sheets of conductive material arranged proximate to the outer arms of the windings and substantially surrounding the deflection coil such that eddy current in said outer arms are coupled to said compensating means thereby generating an electromagnetic field for substantially off-setting the effects of an electromagnetic field generated by eddy currents in the inner arms.

2. The magnetic deflection coil of claim 1 including a first and a second plurality of toroidal conductive windings arranged in quadrature for X and Y deflection of said beam of charged particles.

3. The deflection coil of claim 1 wherein said compensating means arranged proximate to the outer arms of the windings comprise:
thin conductive sheets in a segmented cylindrical shape substantially surrounding the deflection coil.

4. The deflection coil of claim 3 wherein the passive conductive compensating means enhances eddy currents generated by the deflection currents in the outer arms, thereby compensating for eddy currents generated by the deflection currents in the inner arms.

5. The deflection coil of claim 2 wherein the passive conductive compensating means enhances eddy currents generated by the deflection currents in the outer arms, thereby compensating for eddy currents generated by the deflection currents in the inner arms.

6. The deflection coil of claim 2 wherein the passive conductive compensating means enhances eddy currents generated by the deflection currents in the outer arms, thereby compensating for eddy currents generated by the deflection currents in the inner arms.

7. The deflection coil of claim 6 wherein the passive conductive compensating means are oriented in a curved plane centered on an axis orthogonal to the deflection axis, so that the magnetic field lines generated by the outer arms of the coil windings intercept the compensating means at approximately normal angles of incidence.

8. The deflection coil of claim 1 wherein the passive conductive compensating means enhances eddy currents generated by the deflection currents in the outer arms, thereby compensating for eddy currents generated by the deflection currents in the inner arms.

9. The deflection coil of claim 8 wherein the passive conductive compensating means are oriented in a curved plane centered on an axis orthogonal to the deflection axis, so that the magnetic field lines generated by the outer arms of the coil windings intercept the compensating means at approximately normal angles of incidence.

10. The deflection coil of claim 5 wherein the passive conductive compensating means are oriented in a curved plane centered on an axis orthogonal to the deflection axis, so that the magnetic field lines generated by the outer arms of the coil windings intercept the compensating means at approximately normal angles of incidence.

11. The deflection coil of claim 4 wherein the passive conductive compensating means are oriented in a curved plane centered on an axis orthogonal to the deflection axis, so that the magnetic field lines generated by the outer arms of the coil windings intercept the compensating means at approximately normal angles of incidence.

12. The deflection coil of claim 3 wherein the passive conductive compensating means are oriented in a curved plane centered on an axis orthogonal to the deflection axis, so that the magnetic field lines generated by the outer arms of the coil windings intercept the compensating means at approximately normal angles of incidence.

13. The deflection coil of claim 1 wherein the passive conductive compensating means are oriented in a curved plane centered on an axis orthogonal to the deflection axis, so that the magnetic field lines generated by the outer arms of the coil windings intercept the compensating means at approximately normal angles of incidence.

14. The deflection coil of claim 2 wherein the passive conductive compensating means are oriented in a curved plane centered on an axis orthogonal to the deflection axis, so that the magnetic field lines generated by the outer arms of the coil windings intercept the compensating means at approximately normal angles of incidence.

15. The deflection coil of claim 1 wherein the passive conductive compensating means are oriented in a curved plane centered on an axis orthogonal to the deflection axis, so that the magnetic field lines generated by the outer arms of the coil windings intercept the compensating means at approximately normal angles of incidence.

* * * * *